(12) United States Patent
Miyazawa et al.

(10) Patent No.: US 9,419,021 B2
(45) Date of Patent: Aug. 16, 2016

(54) THIN FILM TRANSISTOR CIRCUIT AND DISPLAY DEVICE USING IT

(71) Applicant: Japan Display Inc., Tokyo (JP)

(72) Inventors: Toshio Miyazawa, Tokyo (JP); Takahide Kuranaga, Tokyo (JP)

(73) Assignee: Japan Display Inc., Tokyo (JP)

( * ) Notice: Subject to any disclaimer, the term of this patent is extended or adjusted under 35 U.S.C. 154(b) by 39 days.

(21) Appl. No.: 14/451,461

(22) Filed: Aug. 5, 2014

(65) Prior Publication Data
US 2015/0034950 A1    Feb. 5, 2015

(30) Foreign Application Priority Data

Aug. 5, 2013   (JP) .................................. 2013-162038

(51) Int. Cl.
| | | |
|---|---|---|
| *H01L 27/32* | (2006.01) | |
| *H01L 27/12* | (2006.01) | |
| *G09G 3/36* | (2006.01) | |

(52) U.S. Cl.
CPC .......... *H01L 27/1225* (2013.01); *G09G 3/3674* (2013.01); *G09G 3/3677* (2013.01); *G09G 2310/0286* (2013.01); *G09G 2310/0289* (2013.01); *G09G 2330/021* (2013.01); *H01L 27/3248* (2013.01); *H01L 27/3276* (2013.01)

(58) Field of Classification Search
CPC ............ H01L 27/1225; H01L 27/1255; H01L 27/3276; H01L 27/3272; H01L 27/3248
USPC .......................................................... 257/72
See application file for complete search history.

(56) References Cited

U.S. PATENT DOCUMENTS

| | | | | |
|---|---|---|---|---|
| 2008/0054992 A1* | 3/2008 | Kajiwara | ............. | G09G 3/3696 327/537 |
| 2008/0278650 A1* | 11/2008 | Kajiwara | ............. | G09G 3/3696 349/42 |
| 2009/0225019 A1* | 9/2009 | Miyazawa | ........... | G09G 3/3677 345/99 |
| 2012/0162275 A1* | 6/2012 | Park | .................... | H01L 27/3262 345/690 |
| 2013/0093741 A1* | 4/2013 | Akimoto | .................. | G09G 5/00 345/211 |

FOREIGN PATENT DOCUMENTS

JP          2011-91110 A      5/2011

* cited by examiner

*Primary Examiner* — Nathan Ha
(74) *Attorney, Agent, or Firm* — Typha IP LLC

(57) ABSTRACT

If the threshold of a thin film transistor is depleted, a leak-induced voltage drop takes place and the desired voltage cannot be obtained. Depending on the severity of the phenomenon, the thin film transistor may fail to function. This disclosure offers a thin film transistor circuit having a first transistor connected to a low voltage, and a second transistor connected to the gate of the first transistor. When the gate voltage of the second transistor is changed from the high level to the low level, the gate voltage of the first transistor is brought to a voltage level lower than the low voltage.

13 Claims, 14 Drawing Sheets

THIN FILM TRANSISTOR CIRCUIT AND DISPLAY DEVICE USING IT

CLAIM OF PRIORITY

The present application claims priority from Japanese patent application JP2013-162038 filed on Aug. 5, 2013, the content of which is hereby incorporated by reference into this application.

BACKGROUND

The present disclosure relates to a thin film transistor circuit. More particularly, the disclosure relates to a display device that uses thin film transistors each having an oxide semiconductor.

Today, there are widely used circuits that adopt thin film transistors (TFTs) utilizing amorphous silicon (α-Si) or low-temperature polysilicon (LTPS) in their semiconductor layer constituting drive circuits of a display device such as an active matrix liquid crystal display or an electroluminescence (EL) display.

Meanwhile, thermal processes are indispensable for the production of the TFTs. That means it is difficult to use flexible substrates such as plastic or film substrates known to have low resistance to heat.

Under such circumstances, efforts have been underway to develop a TFT that utilizes an oxide semiconductor easy to deposit at low temperature in the channel layer (semiconductor layer) (e.g., Japanese Published Unexamined Patent Application No. 2011-91110).

SUMMARY

The thin film transistor circuits such as gate scan circuits incorporated in the display panel are formed by so-called single-channel TFTs such as LTPS having either n- or p-type polarity.

These thin film transistor circuits are each designed by assuming the use of an enhancement-type TFT whose threshold (Vth) is 0V or higher. That is, the n-type TFT, for example, is designed to block the current flow (OFF state) when the gate voltage is brought to the lowest level of the working voltage.

In that respect, the TFTs such as LTPS have few problems because they control the threshold Vth by impurity implantation (e.g., ion implantation) or like methods. On the other hand, in the case of the TFTs such as oxide semiconductor TFTs whose Vth control is extremely difficult, it is necessary to construct the thin film transistor circuit in a state where the threshold Vth is depleted (i.e., Vth is less than 0V (minus)).

However, if the threshold Vth of the TFTs is depleted, a leak-induced voltage drop takes place and the desired voltage cannot be obtained. Depending on the severity of the phenomenon, the TFTs may fail to function.

In carrying out the present disclosure and according to a typical, simplified embodiment thereof, there is provided a thin film transistor circuit having a first transistor connected to a low voltage and a second transistor connected to the gate of the first transistor. When a gate voltage of the second transistor is changed from a high level to a low level, the gate voltage of the first transistor is brought to a voltage level lower than the low voltage.

According to the above-outlined thin film transistor circuit, leaks are reduced even if the threshold Vth is depleted.

BRIEF DESCRIPTION OF THE DRAWINGS

Further objects and advantages of the present disclosure will become apparent upon a reading of the following description and appended drawings in which.

DESCRIPTION OF THE PREFERRED EMBODIMENTS

Figure 9:
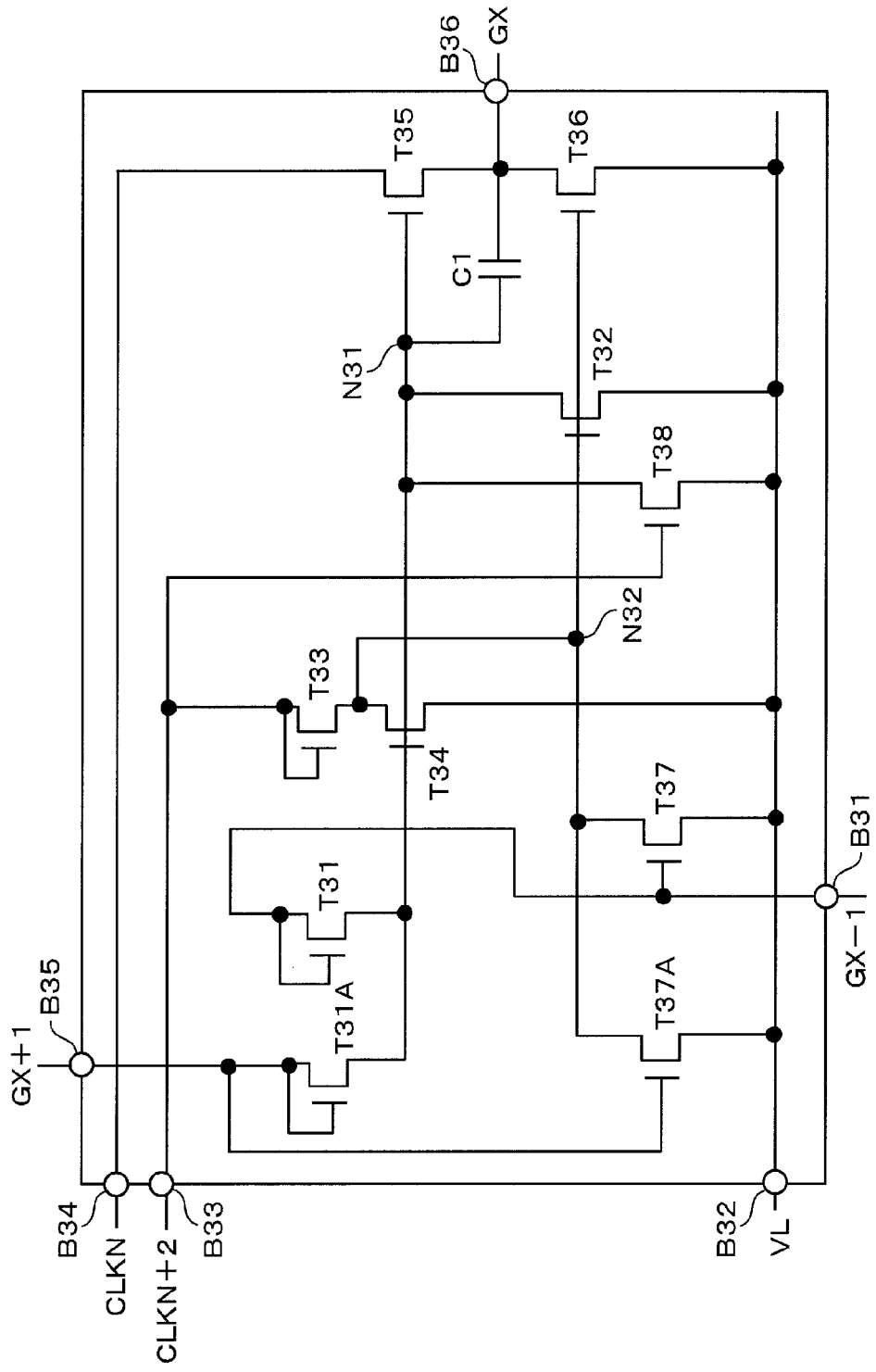
FIG. 9 is a circuit diagram of a thin film transistor circuit as a comparative example.
Figure 10:
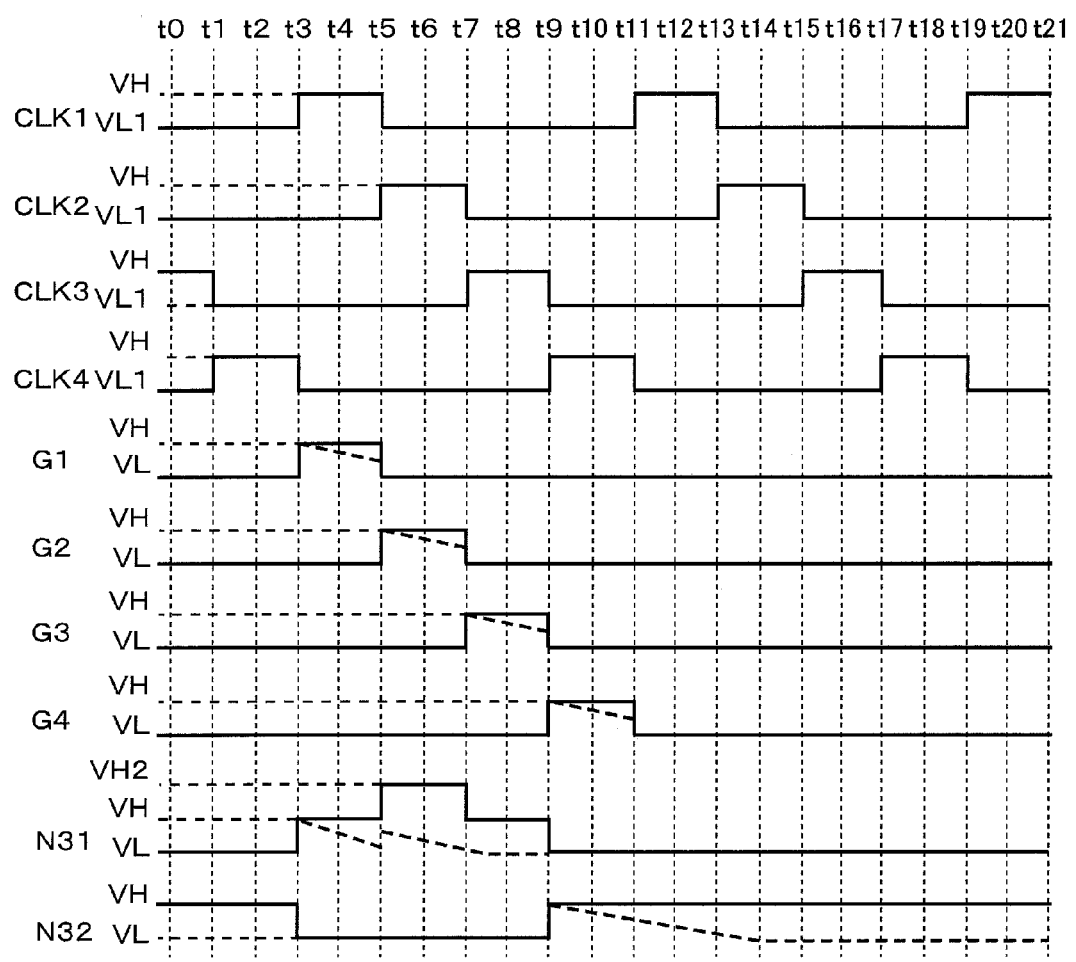
FIG. 10 is a timing chart of a scan circuit that uses the thin film transistor circuit of the comparative example.

Outlined below with reference to FIGS. 9 and 10 is a typical defect incurred when the TFT threshold Vth is depleted in a thin film transistor circuit (of the comparative example) that operates when the TFT threshold Vth is enhanced. FIG. 9 is a circuit diagram of a thin film transistor circuit as the comparative example. FIG. 10 is a timing chart of a scan circuit that uses the thin film transistor circuit of the comparative example.

The scan circuit is structured by having the thin film transistor circuit of FIG. 9 connected in multiple stages. The thin film transistor circuits in these stages have the same circuit structure but admit different input signals. A gate drive signal (GX−1) output from a boundary node B36 of a front-stage thin film transistor circuit is input to transistors T31 and T37 via a boundary node B31. A gate drive signal (GX+1) output from the boundary node B36 of the next-stage thin film transistor circuit is input to transistors T31A and T37A via a boundary node B35. A low voltage (VL) is input to transistors T32, T34, T36, T37, T37A and T38 via a boundary node B32. A control pulse (CLKN) is input to a transistor T35 via a boundary node B34. A control pulse (CLKN+2) is input to transistors T33 and T38 via a boundary node B33.

In the thin film transistor circuit of FIG. 9, it is assumed that X=2 and N=2. On that assumption, a control pulse (CLK2) is input to the boundary node B34 and another control pulse (CLK4) is input to the boundary node B33. A gate drive signal (G2) is output from the boundary node B36. In reference to the thin film transistor circuit for which X=2 and N=2, a thin film transistor circuit for which X=1 and N=1 is called the front-stage thin film transistor circuit, and a thin film transistor circuit for which X=3 and N=3 is called the next-stage thin film transistor circuit. In the front-stage thin film transistor circuit, a control pulse (CLK1) is input to the boundary node B34 and another control pulse (CLK3) is input to the boundary node B33. Also, a gate drive signal (G1) is output from the boundary node B36. In the next-stage thin film transistor circuit, the control pulse (CLK3) is input to the boundary node B34 and the control pulse (CLK1) is input to the boundary node B33. Further, the gate drive signal (G3) is output from the boundary node B36.

Outlined below with reference to FIG. 10 are the workings of the scan circuit that uses the thin film transistors of the comparative example.

(a) from Time t3 to Time t5

At time t3, the control pulse (CLK4) is driven low (VL1). This causes the thin film transistor T38 to be turned OFF. Also, the gate drive signal (G1) of the front-stage thin film transistor circuit is driven high (VH), the transistor T37 of the thin film transistor circuit is turned ON, and a node N32 is driven low (VL) so that the transistor T36 is turned OFF. When the gate drive signal (G1) is driven high, a node 31 is driven high (VH) via the thin film transistor T31.

(b) from Time t5 to Time t7

At time t5, the control pulse (CLK2) is changed from the low level (VL1) to the high level (VH). This boosts the voltage of the gate drive signal (G2) and raises the voltage of the node N31 via a bootstrap capacitor C1, which in turn raises the gate voltage of the transistor T35.

(c) from Time t7 to Time t9

At time t7, the control pulse (CLK2) is driven low (VL1) and the gate drive signal (G2) is driven low (VL). Also, the gate drive signal (G3) of the next-stage thin film transistor circuit is driven high (VH), and the node N31 is driven high (VH) via the thin film transistor T31A.

(d) from Time t9 to Time t11

At time t9, the control pulse (CLK4) is driven high (VH), and the node N32 is driven high (VH) via the thin film transistor T33, so that the thin film transistor T36 is turned ON.

When the threshold Vth is enhanced, the TFTs operate in a manner reflecting their design intent as indicated with thick lines in FIG. 10. When the threshold Vth is depleted, the transistors such as T32 and T36 cannot be completely turned OFF and develop a leak-induced voltage drop as indicated with dotted lines in FIG. 10. This makes it impossible to acquire the desired voltage output. In some cases, the transistors do not function.

By contrast, the thin film transistor circuit embodying the present disclosure has a first transistor connected to a low voltage and a second transistor connected the gate of the first transistor. When the gate voltage of the second transistor is changed from the high level to the low level, the gate voltage of the first transistor is brought to a voltage level lower than the low voltage. This arrangement allows the first transistor to be turned OFF even if it is depleted of charge.

Some preferred embodiments of the present disclosure are explained below using the accompanying drawings. In the ensuing explanation, like or corresponding parts are designated by like reference numerals, and their explanations are omitted where redundant. Although the embodiments will be described using n-type TFTs as an example, this is not limitative of the present disclosure. Alternatively, p-type TFTs may be adopted. The semiconductor layer making up the TFTs is not limited to the oxide semiconductor; polysilicon or amorphous silicon may be used alternatively to constitute the semiconductor layer. Whereas the gate scan circuit will be used as an example for explanation, this is not limitative of the present disclosure. Obviously, circuits that adopt TFTs can also be used.

First Embodiment

Figure 11:
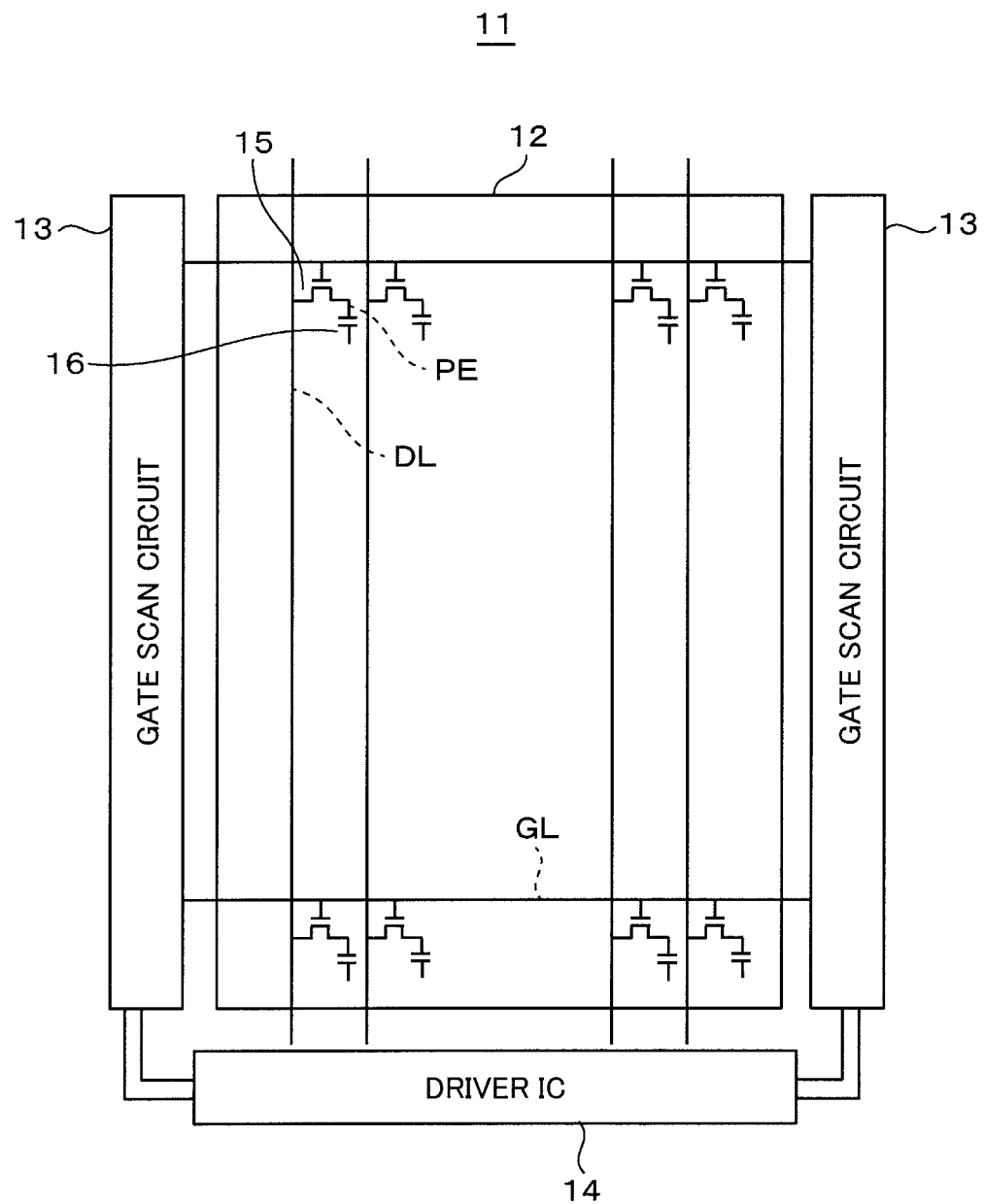
FIG. 11 is a diagram showing a display device of the first embodiment.

FIG. 11 is a diagram showing a display device 11 of the first embodiment. The display device 11 is an active matrix display device. As such, the display device 11 includes a display unit 12, gate scan circuits 13, and a drive IC 14. In the description that follows, the gate scan circuits will be simply referred to as the scan circuit. In the display unit 12, pixels PE are positioned in arrays. The pixels PE each include a thin film transistor 15 and a capacitor 16 composed of a source electrode and a common electrode. The scan circuit 13 drives signal lines GL connected to the gate electrode of each thin film transistor 15. The driver IC 14 includes circuits that drive signal lines DL connected to the drain electrode of each thin film transistor 15, and circuits that supply control pulses, drive pulses, and voltages to the scan circuit 13. The scan circuit 13 is formed by thin film transistors on a TFT substrate of the display device 11. For example, the driver IC 14 may be a semiconductor chip manufactured by CMOS (Complementary Metal Oxide Semiconductor) processes on a silicon substrate, the chip being mounted on a COG (Chip On Glass) basis on the TFT substrate of the display device 11.

Figure 1A:
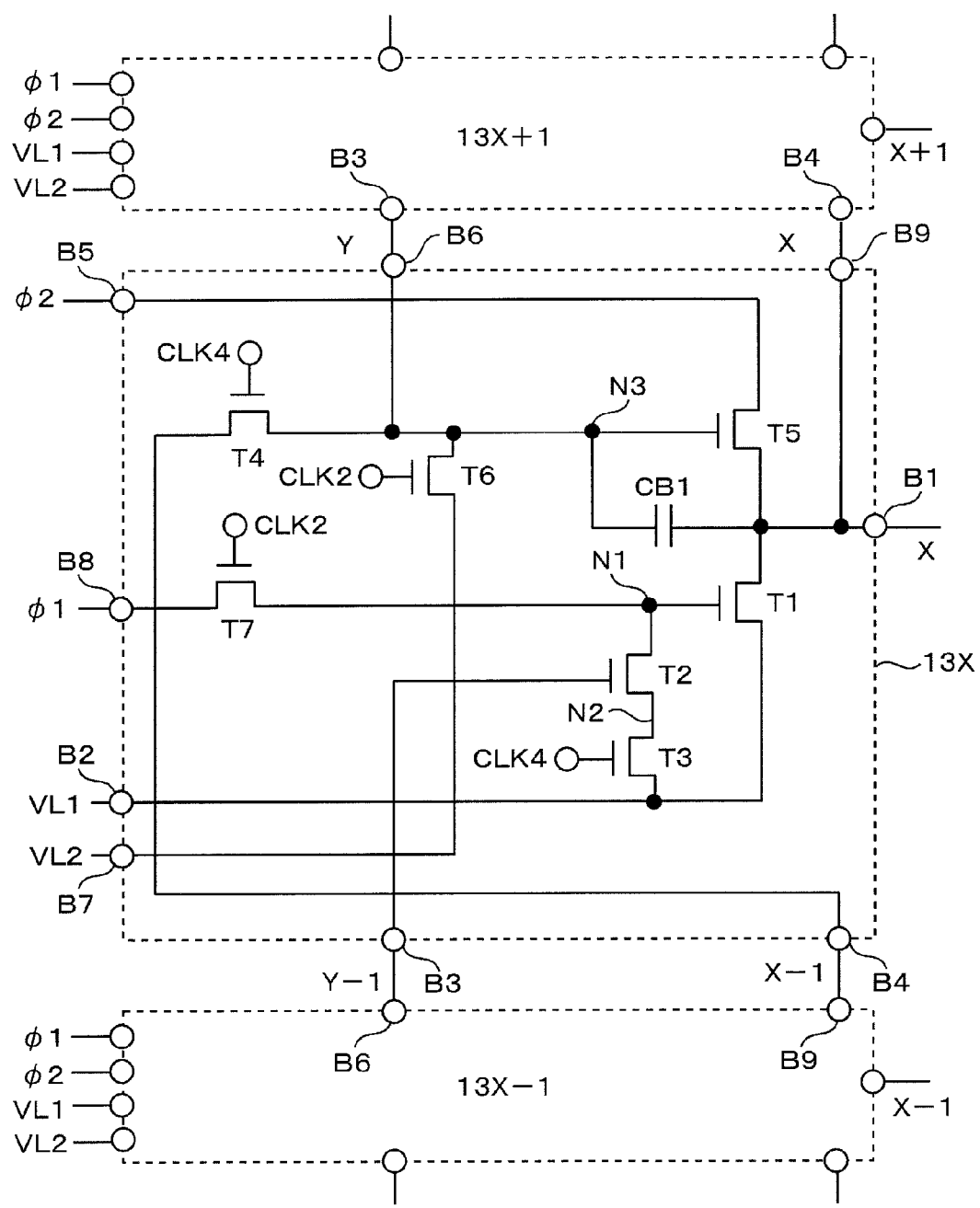
FIG. 1A is a circuit diagram of a thin film transistor circuit as a first embodiment of the present disclosure.
Figure 1B:
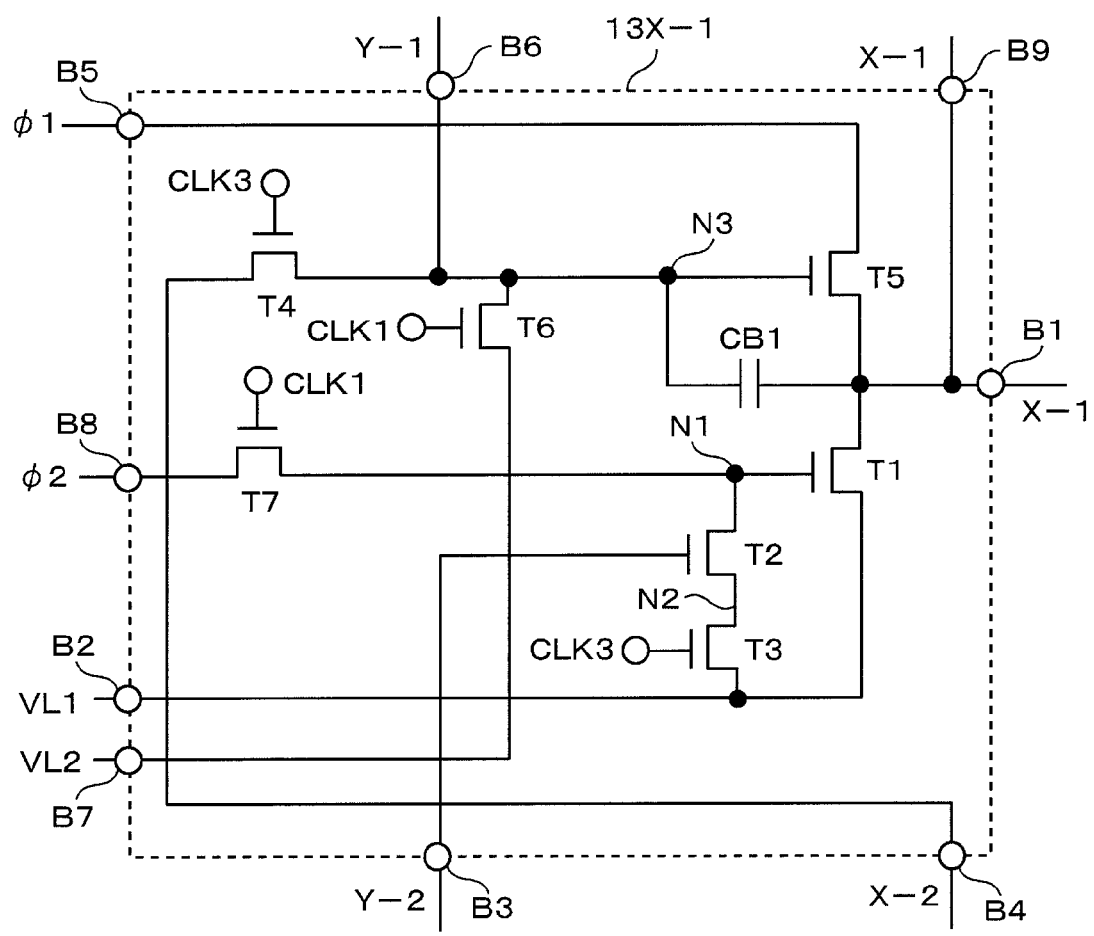
FIG. 1B is another circuit diagram of the thin film transistor circuit as the first embodiment.
Figure 1C:
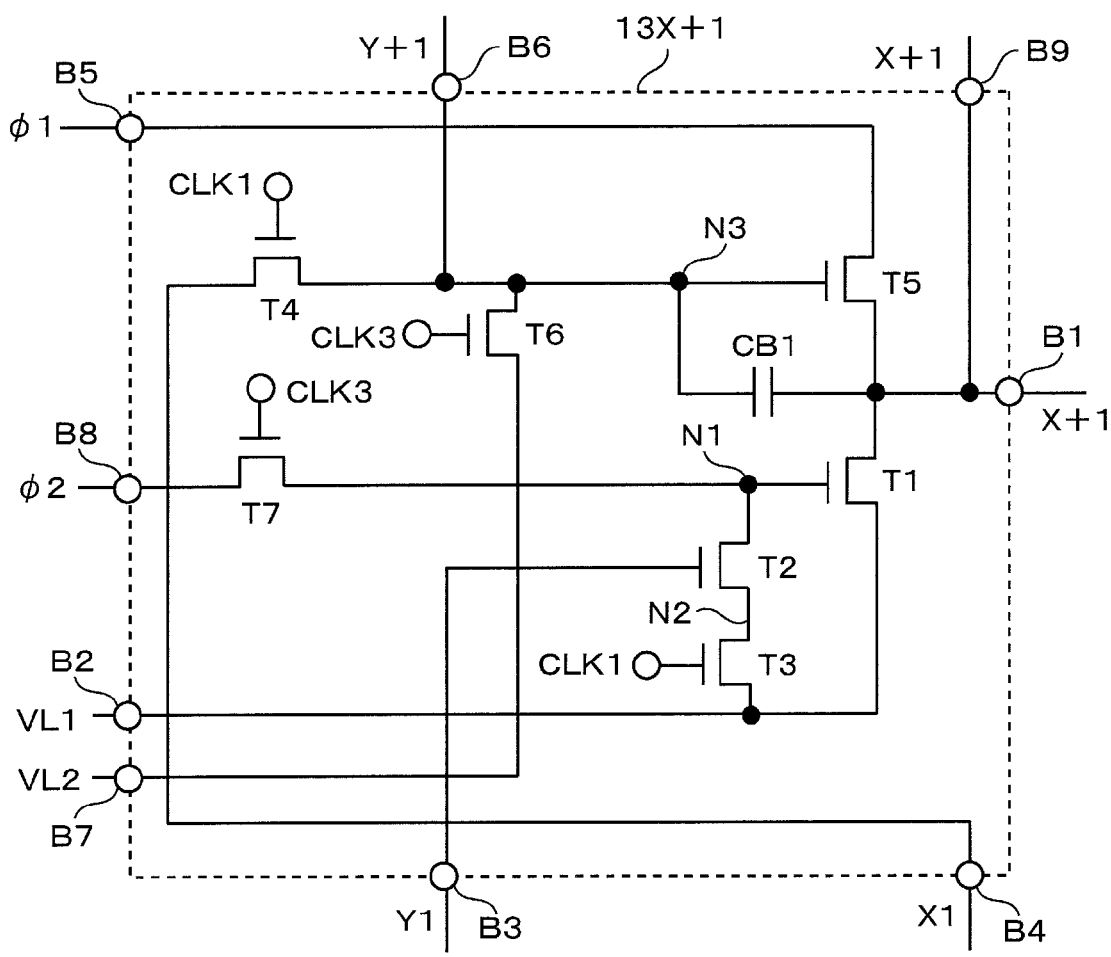
FIG. 1C is another circuit diagram of the thin film transistor circuit as the first embodiment.
Figure 1D:
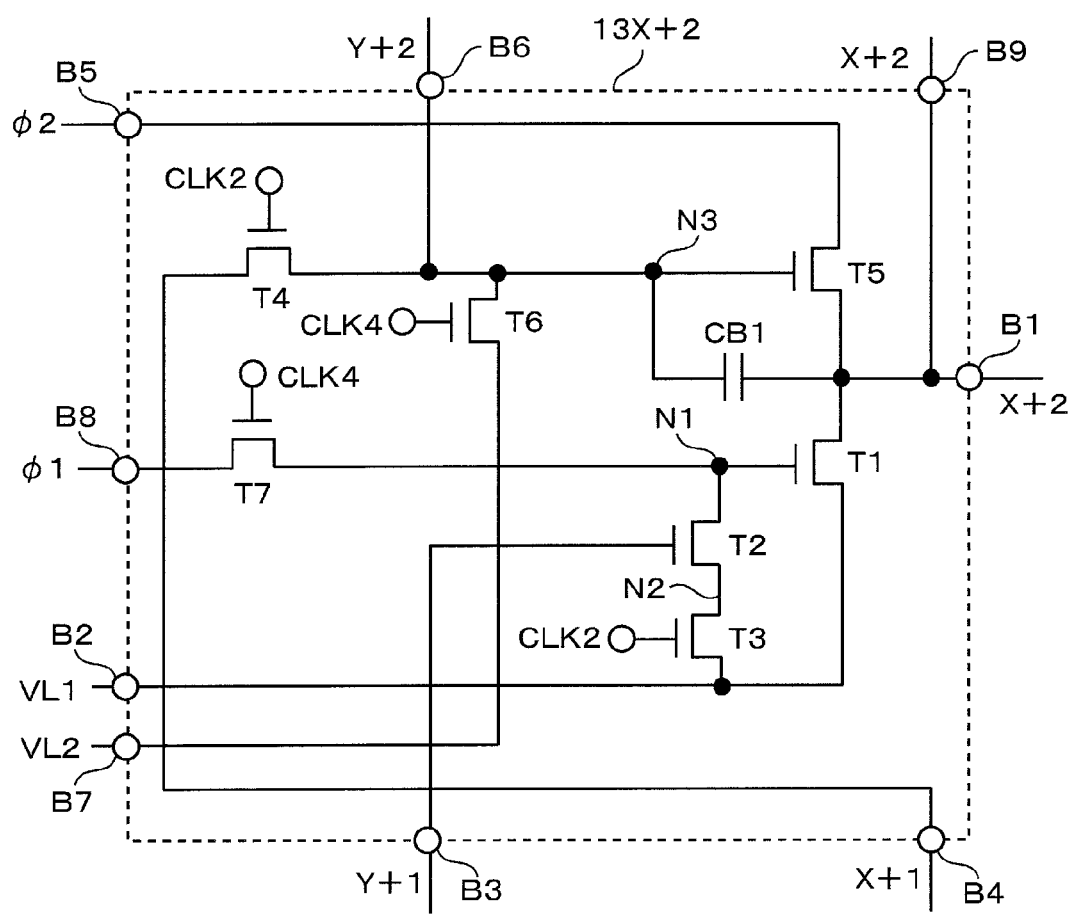
FIG. 1D is another circuit diagram of the thin film transistor circuit as the first embodiment.
Figure 2:
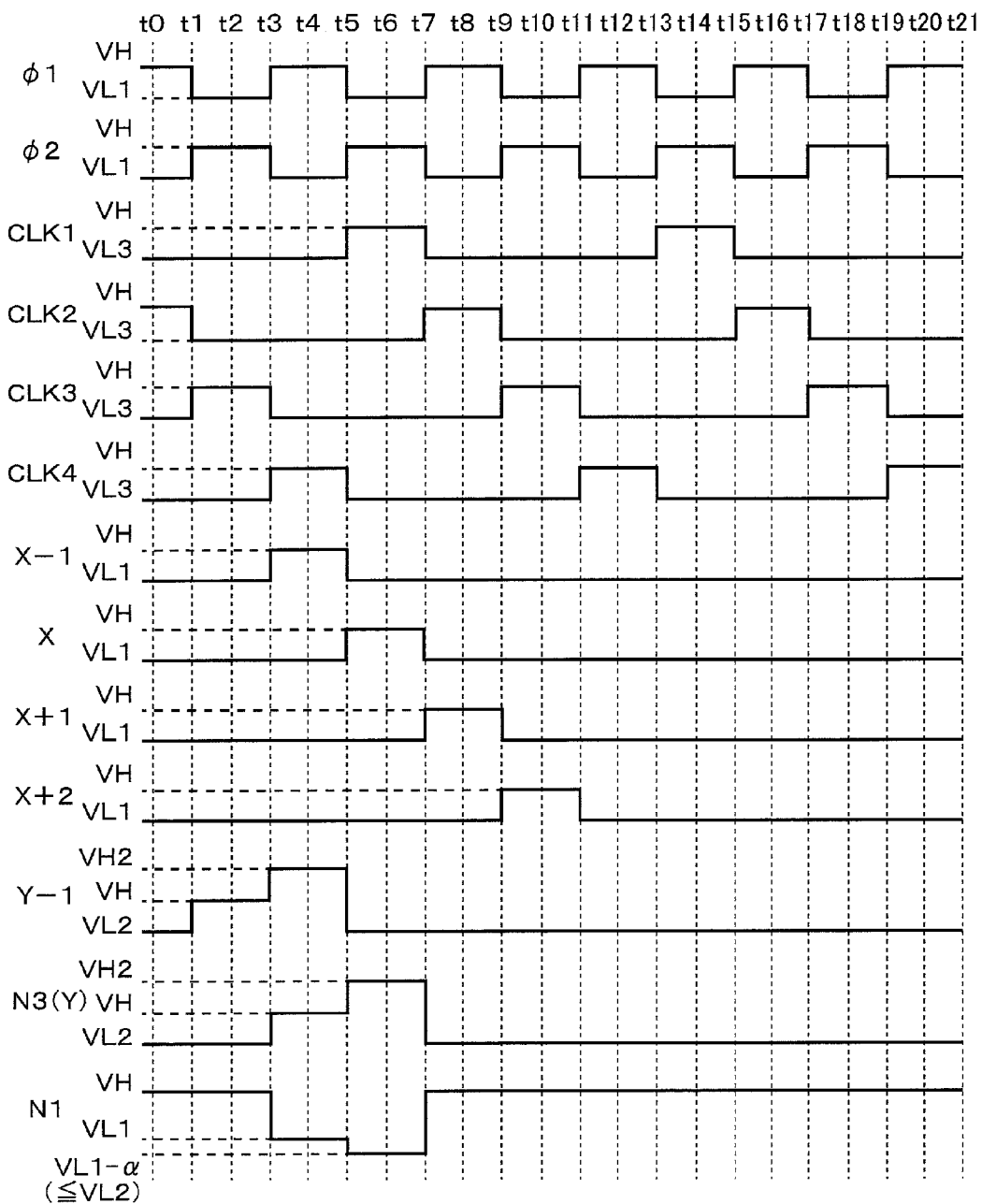
FIG. 2 is a timing chart of a scan circuit that uses the thin film transistor circuit of the first embodiment.

FIGS. 1A, 1B, 1C and 1D are circuit diagrams of the thin film transistor circuit as the first embodiment. FIG. 2 is a timing chart of a scan circuit that uses the thin film transistor circuit of the first embodiment. The scan circuit 13 is formed by connecting multiple combinations of thin film transistor circuits 13X−1, 13X, 13X+1 and 13X+2. For example, output signals (X−1) and (Y−1) from the front-stage thin film transistor circuit 13X−1 are input to the thin film transistor circuit 13X via boundary nodes B4 and B3, respectively. Output signals (X) and (Y) from the thin film transistor circuit 13X are input to the boundary nodes B4 and B3 of the next-stage thin film transistor circuit 13X+1 via boundary nodes B9 and B6, respectively. A drive pulse ($\psi$1) or ($\psi$2) from a boundary node B8, a drive pulse ($\psi$2) or ($\psi$1) from a boundary node B5, a first low voltage (VL1) from a boundary node B2, and a second low voltage (VL2) from a boundary node B7 are input to the thin film transistor circuits 13X−1, 13X, 13X+1 and 13X+2. The control pulses (CLK1 to CLK4) are input to the thin film transistor circuits 13X−1, 13X, 13X+1 and 13X+2. Output signals (X−1, X, X+1, X+2) for driving the gate signal lines GL are output from boundary nodes B1 of the thin film transistor circuits 13X−1, 13X, 13X+1 and 13X+2, respectively. Incidentally, the boundary node B9 may be the same as the boundary node B1. The thin film transistor circuits 13X−1, 13X, 13X+1 and 13X+2 making up the scan circuit 13 have the same circuit structure but have different drive pulses and control pulses input thereto.

The thin film transistor circuits 13X−1, 13X, 13X+1 and 13X+2 each have transistors T1, T2, T3, T4, T5, T6 and T7 and a bootstrap capacitor CB1. The transistors T1, T2, T3, T4, T5, T6 and T7 are n-type thin film transistors (TFTs).

The pulses $\psi$1 and $\psi$2 are complementary to each other. When the pulse $\psi$1 is at the high level, the pulse $\psi$2 is at the low level; when the pulse $\psi$1 is at the low level, the pulse $\psi$2 is at the high level. The control pulses CLK1 through CLK4 are driven high successively from CLK1 to CLK2 to CLK3 to CLK4 to CLK1, and so on. The high level of the pulses $\psi$1 and $\psi$2 is VH, and their low level is VL1. The high level of the control pulses CLK1 through CLK4 is VH, and their low level is a third low voltage (VL3). The relations between the voltages involved are set as in the following expression (1):

$$VL1 > VL2 > VL3 \quad (1)$$

If the threshold of the depleted n-type TFT is assumed to be −Vth, the low voltages involved are to satisfy the following expressions (2) and (3):

$$VL1 - VL2 \geq Vth \quad (2)$$

$$VL2 - VL3 \geq Vth \quad (3)$$

For example, if Vth=1V and VL1=−12V, then the above expressions (1), (2) and (3) are satisfied when VL2=−14V and VL3=−16V.

The workings of the scan circuit 13 are explained below with reference to FIG. 2.

(a) from Time t1 to Time t3

At time t1, a node N3 of the front-stage thin film transistor circuit 13X−1 (gate node of the transistor T5), i.e., the output signal (Y−1), is driven high (VH). This turns ON the transistor T2 of the thin film transistor circuit 13X, connecting a node N1 (gate node of the transistor T1) with a node N2. However, since the transistor T3 remains OFF, the voltage fluctuation of the node N1 is negligible and the transistor T1 remains ON. Here, the node N1 is interposed between the transistor T7 and the transistor T1 and is a connection point between the transistor T2 and the transistor T3. The node N2 is a connection point between the transistor T2 and the transistor T3.

(b) from Time t3 to Time t5

At time t3, with the pulse CLK4 driven high, the output signal (X−1) from the front-stage thin film transistor circuit 13X−1 is driven high (VH). The resulting bootstrap effect causes the output signal (Y−1) from the front-stage thin film transistor circuit X13−1 to be stepped up in voltage to reach VH2 that is a higher voltage than VH. The output signal (X−1) from the front-stage thin film transistor circuit 13X−1 is driven high (VH) and the pulse CLK4 is also driven high. This turns ON the transistor T4 of the thin film transistor circuit 13X and drives the node N3 high (VH). Because the high-level pulse CLK4 turns ON the transistor T3, the nodes N1 and N2 are driven low (VL1). Here, the node N3 is interposed between the transistor T4 and the transistor T5 and serves as a connection point between the gate of the transistor T5 and one end of the bootstrap capacitor CB1.

(c) from Time t5 to Time t7

At time t5, the pulse CLK4 is driven low, the pulse ψ1 is driven low, and the pulse ψ1 is changed from the low level to the high level. At this point, the transistor T3 is turned OFF and the output signal (Y−1) from the front-stage thin film transistor circuit 13X−1 is changed in voltage from VH2 to VL2. This causes the gate voltage of the transistor T2 in the thin film transistor circuit 13X to change significantly in the negative direction. The change in the gate voltage of the transistor T2 lowers the voltage of the nodes N1 and N2 that have been put in a floating state by the transistor T3 being OFF, down to a voltage level (VL1−α) lower than VL1. If the size of the transistor T2 is set so as to satisfy the following expression (4), then the transistor T1 is turned OFF:

$$VL1 - \alpha \leq VL2 \quad (4)$$

For example, if VL1=−12V and VL2=−14V, then the above expression (4) is satisfied when α=3V. Since the pulse ψ2 is changed from the low level to the high level, the voltage of the output signal (X) is raised. That in turn boosts the voltage of the node N3 through the bootstrap capacitor CB1 and raises the gate voltage of the transistor T5. It is easy to set the bootstrap capacitor CB1 in such a manner that the voltage of the output signal (X) becomes the high level of the pulse ψ2. At this point, the gate voltage of the transistor T1 is lower than VL2 as mentioned above, so that the transistor T1 remains OFF. As a result, no leak current occurs via the transistor T1 and the output signal (X) reaches the desired high level voltage (VH). Since the gate voltage of the transistor T6 is VL3 that is lower than VL2, the transistor T6 remains OFF so that no leak current occurs via the transistor T6.

(d) from Time t7 to Time t9

At time t7, the pulse ψ2 is driven low, the pulse ψ1 is driven from low to high, and the pulse CLK2 is driven high. With the pulse CLK2 driven high, the transistors T6 and T7 are turned ON. With the transistor T6 turned ON, the node N3 is driven low. The node N3, i.e., gate voltage of the transistor T5, is driven low (VL2) and the transistor T5 is turned OFF, so that the current of the pulse ψ2 will not subsequently leak to the output signal (X) via the transistor T5. With the transistor T7 turned ON and with the pulse ψ1 driven high, the node N1 is driven high (VH) and the transistor T1 is turned ON. This drives the output signal (X) low (VL1).

According to the first embodiment described above, it is possible to implement a circuit free of leak currents and of through-currents triggered by leak currents, by use of the TFTs formed by the oxide semiconductor whose Vth control is difficult to perform or the depleted TFTs not subject to Vth control such as the TFTs of LTPS. Also with the TFTs of LTPS, there is no need to perform ion implantation for Vth control so that the manufacturing processes can be simplified.

Second Embodiment

Figure 3:
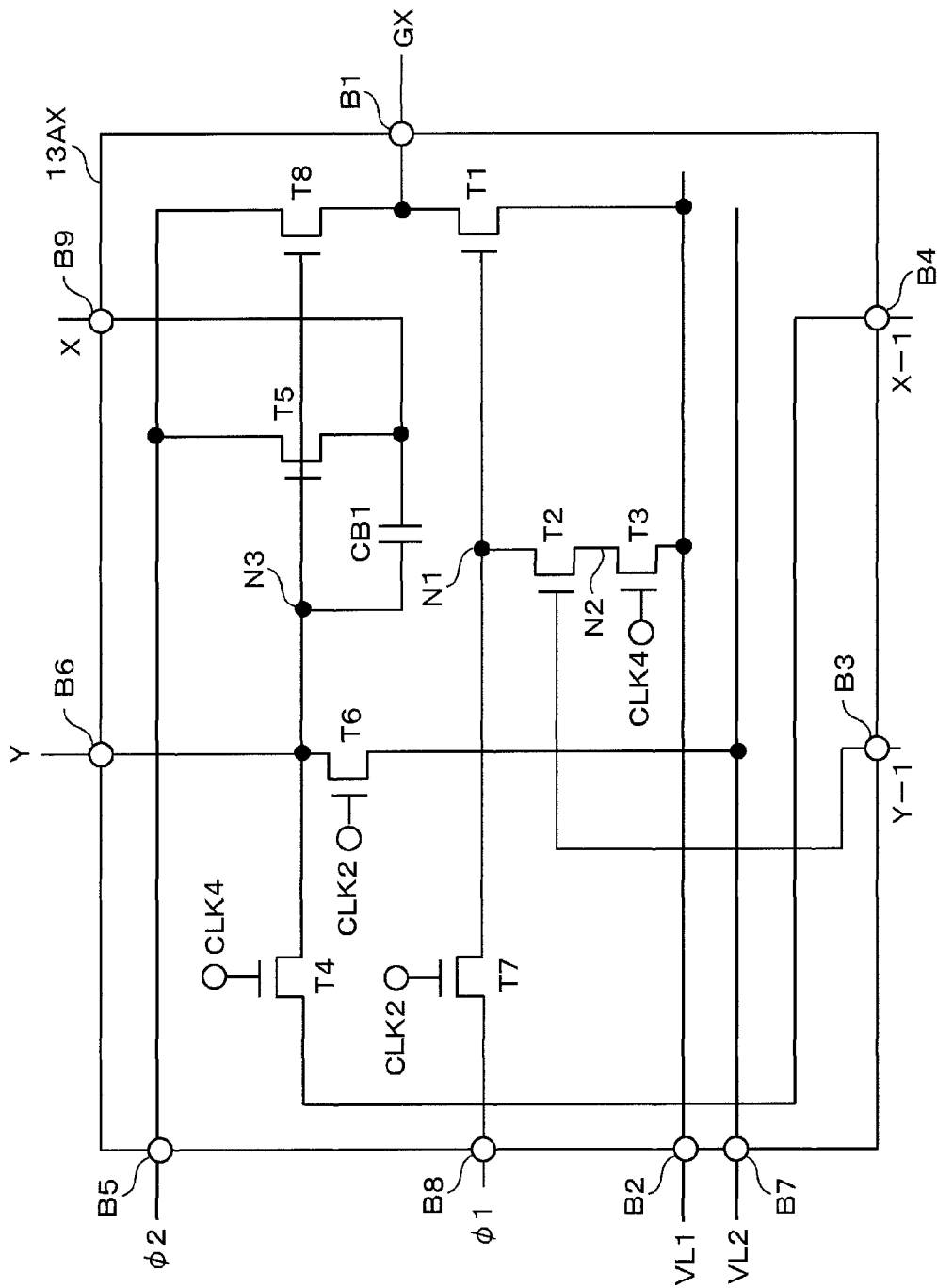
FIG. 3 is a circuit diagram of a thin film transistor circuit as a second embodiment of the present disclosure.

FIG. 3 is a circuit diagram of a thin film transistor circuit as the second embodiment of the present disclosure. As with the first embodiment, the scan circuit 13 is structured by connecting multiple thin film transistor circuits 13AX. In the first embodiment, the scan circuit is configured so that the output signal (X) is transferred to the next-stage thin film transistor circuit and also serves as the voltage output to the gate signal lines GL. Generally, the vertical gate signal lines of a display panel that incorporates gate scan circuits have large capacitance and thus have a long rise time (of voltage rise). That leads to a long delay time in transferring signals to the next-stage thin film transistor circuit. This does not contribute to increasing the transfer rate of gate scan circuits in setups involving large numbers of pixels. Under these circumstances, the gate scan circuit of the second embodiment is designed to minimize the increase in the transfer delay time by distinguishing the transistors for outputting the transfer output signal (X) from the transistors for outputting an output signal (GX) onto the gate signal lines GL.

The thin film transistor circuit 13AX of the second embodiment is formed by supplementing the thin film transistor circuit 13A of the first embodiment with a transistor T8 as an additional circuit element and by reconnecting the transistor T1 from the transistor T5 to the transistor T8. That is, the transistor T8 is connected interposingly between the boundary node B5 and the boundary node B1, and the gate of the transistor T8 is connected to the node N3. The workings of the thin film transistor circuit 13AX are the same as the first embodiment and thus will not be discussed further. The transistor T8 is an n-type TFT.

There is no clearly defined bootstrap capacitor interposed between the node N3 and the boundary node B1. That is because the transistor T8 is a TFT with a large gate width (W) so that the channel-gate capacitance of each TFT has a function similar to the bootstrap capacitor. Alternatively, a bootstrap capacitor may be additionally interposed between the node N3 and the boundary node B1.

Third Embodiment

Figure 4:
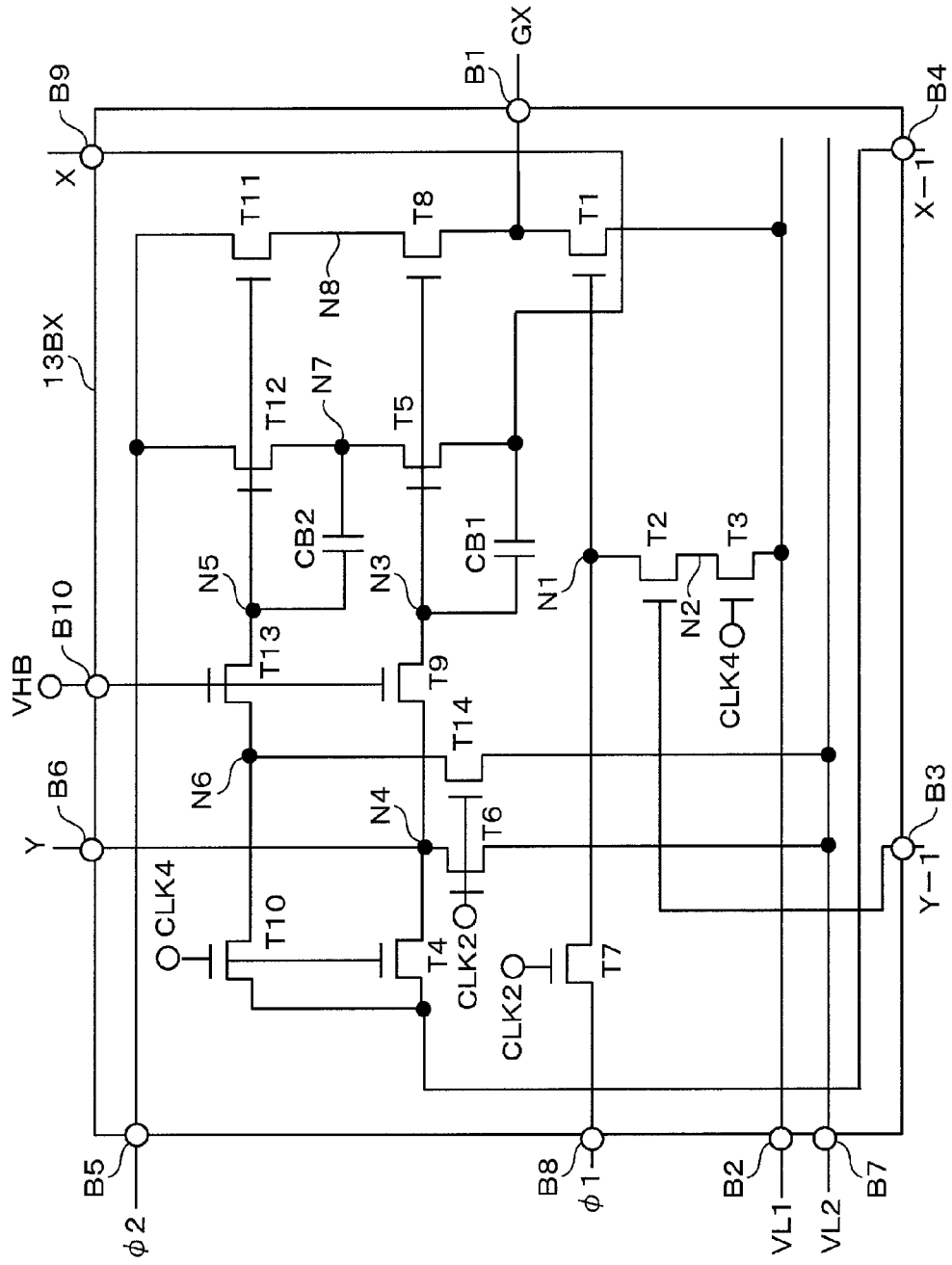
FIG. 4 is a circuit diagram of a thin film transistor circuit as a third embodiment of the present disclosure.
Figure 5:
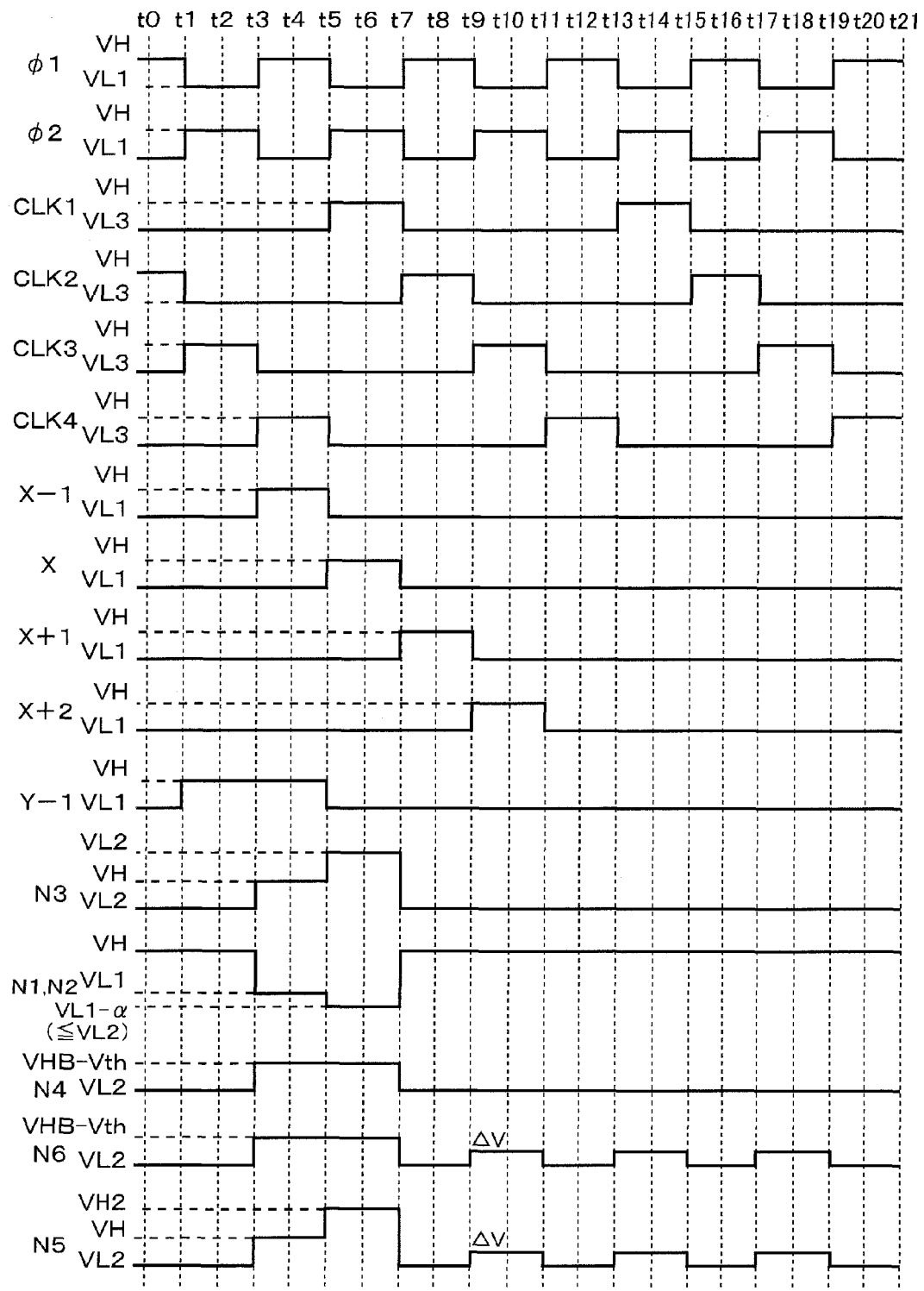
FIG. 5 is a timing chart of a scan circuit that uses the thin film transistor circuit of the third embodiment.

FIG. 4 is a circuit diagram of a thin film transistor circuit as the third embodiment of the present disclosure. FIG. 5 is a timing chart of a scan circuit that uses the thin film transistor circuit of the third embodiment. As with the first embodiment, the scan circuit 13 is structured by connecting multiple thin film transistor circuits 13BX. Compared with the thin film transistor circuit 13AX of the second embodiment, the thin film transistor circuit 13BX of the third embodiment is supplemented by the circuits listed in the paragraphs below. The added transistors are an n-type TFT each.

(a) Combination of transistors T9 and T11 whose gate voltage is biased at a constant level (VHB)

(b) Combination of transistors T10, T11 and T12 and bootstrap capacitor CB2

The role of the combination of the transistors T9 and T11 in the paragraph (a) above is to reduce the unnecessary parasitic capacitance during the voltage rise caused by the bootstrap effect in order to improve bootstrap efficiency. If the high level of the node N4 is VH as a result of voltage transfer of the output signal (X−1) from the front-stage thin film transistor circuit, and if suitable settings are made to satisfy the expression (5) below, the voltage of the nodes N3 and N5 at time t3 through time t5 in FIG. 5 becomes VH. For example, VHB is 15V.

$$VHB = VH + V\text{th} \quad (5)$$

Since the depleted transistors are being targeted here, the expression (5) above may be turned into the following expression (6):

$$VHB = VH - (\text{absolute value of } V\text{th}) \quad (6)$$

When the pulse φ2 is driven high at time t5 through time t7 in FIG. 5, the bootstrap effect steps up the voltage of the node N3 and node N5 (gate node of the transistor T12) to VH2 (>VH). However, the voltage of the nodes N4 and N6 remains unchanged because the transistors T9 and T13 are turned OFF. That is, the parasitic capacitance attributable to the nodes N4 and N6 does not act as the parasitic capacitance when the bootstrap effect is applied, so that bootstrap efficiency is enhanced. Here, the node N4 is a connection point between the transistor T4 and the transistor T9 and connects with the transistor T6. The node N6 is a connection point between the transistor T10 and the transistor T13 and connects with the transistor T14. The node N5 is interposed between the transistor T13 and the transistor T12 and serves as a connection point between the gate of the transistor T12 and one end of the bootstrap capacitor CB2.

The role of the combination of the transistors T10, T11 and T12 and of the bootstrap capacitor CB2 in the paragraph (b) above is to prevent a voltage rise of the output signal (X) leading to a malfunction as a result of crosstalk or other irregularities when the pulse φ2 is driven high at unselected time (when the transistors T5 and T8 are turned OFF). When the pulse φ2 is driven high at unselected time, the voltage of the nodes N5 and N6 rises by ΔV as shown at time t9 through time t11 in FIG. 5. That is because the thin film transistors T11 and T12 have a relatively large gate width (W) and thus have a large source-gate capacitance that enhances the voltage step-up effect through capacitive coupling, and because the nodes N5 and N6 in this circuit configuration are in a floating state at this time. However, the output signal (X) is not stepped up in voltage because of the presence of the transistors T5 and T8 and the bootstrap capacitor CB1. That is, without the combination of the transistors T10, T11 and T12 and the bootstrap capacitor CB2 in the paragraph (b) above, the voltage at the boundary nodes B1 and B9 would rise by ΔV as with the nodes N5 and N6. This, as with the transistors T11 and T12, is due to the fact that the thin film transistors T5 and T8 have a relatively large gate width (W) and thus have a large source-gate capacitance that enhances the voltage step-up effect through capacitive coupling, and that the nodes N2 and N4 are in a floating state at this time. Because the combination of the transistors T10, T11 and T12 and the bootstrap capacitor CB2 in the paragraph (b) above serve as a buffer that dampens the voltage rise caused by the pulse φ2 being driven high at the nodes N7 and N8, malfunctions attributable to the voltage rise of the output signal (X) can be suppressed. Here, the node N7 is a connection point between the transistor T12 and the transistor T5 and connects with the other end of the bootstrap capacitor CB2. The node N8 is a connection point between the transistor T11 and the transistor T8.

In FIG. 4, there is no clearly defined bootstrap capacitor interposed between the node N3 and the boundary node B1 and between the node N5 and the node N8. That is because the transistors T11 and T8 are TFTs with a large gate width (W) so that the channel-gate capacitance of each TFT has a function similar to the bootstrap capacitor. Alternatively, a bootstrap capacitor may be additionally interposed between the node N3 and the boundary node B1 as well as between the node N5 and the node N8.

Fourth Embodiment

Figure 6:
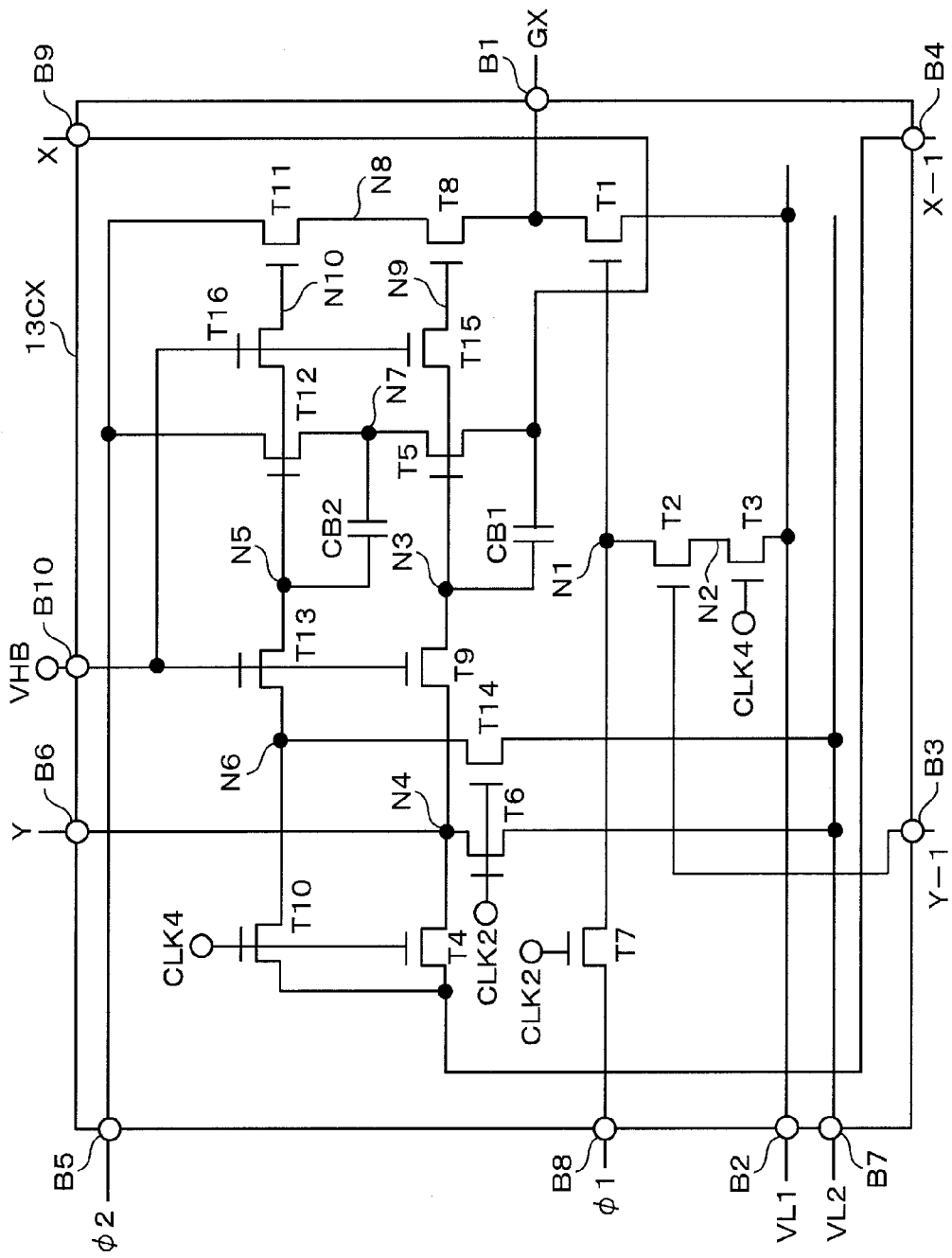
FIG. 6 is a circuit diagram of a thin film transistor circuit as a fourth embodiment of the present disclosure.

FIG. 6 is a circuit diagram of a thin film transistor circuit as the fourth embodiment of the present disclosure. As with the first embodiment, the scan circuit 13 is structured by connecting multiple thin film transistor circuits 13CX. The thin film transistor circuit 13CX of the fourth embodiment is formed by supplementing the thin film transistor circuit 13BX of the third embodiment with transistors T15 and T16. The role of the transistors T15 and T16 is the same as that of the components listed in the paragraph (a) above in connection with the third embodiment and thus will not be discussed further. The transistor T15 is interposed between the gate of the transistor T8 (node N9) and the node N3. The transistor T16 is interposed between the gate of the transistor T11 (node N10) and the node N5. A predetermined voltage (VHB) is applied to the gates of the transistors T15 and T16. The transistors T15 and T16 are an n-type TFT each.

In FIG. 6, there is no clearly defined bootstrap capacitor interposed between the node N9 and the boundary node B1 and between the node N10 and the node N8. That is because the transistors T11 and T8 are TFTs with a large gate width (W) so that the channel-gate capacitance of each TFT has a function similar to the bootstrap capacitor. Alternatively, a bootstrap capacitor may be additionally interposed between the node N9 and the boundary node B1 as well as between the node N10 and the node N8.

Fifth Embodiment

Figure 7:
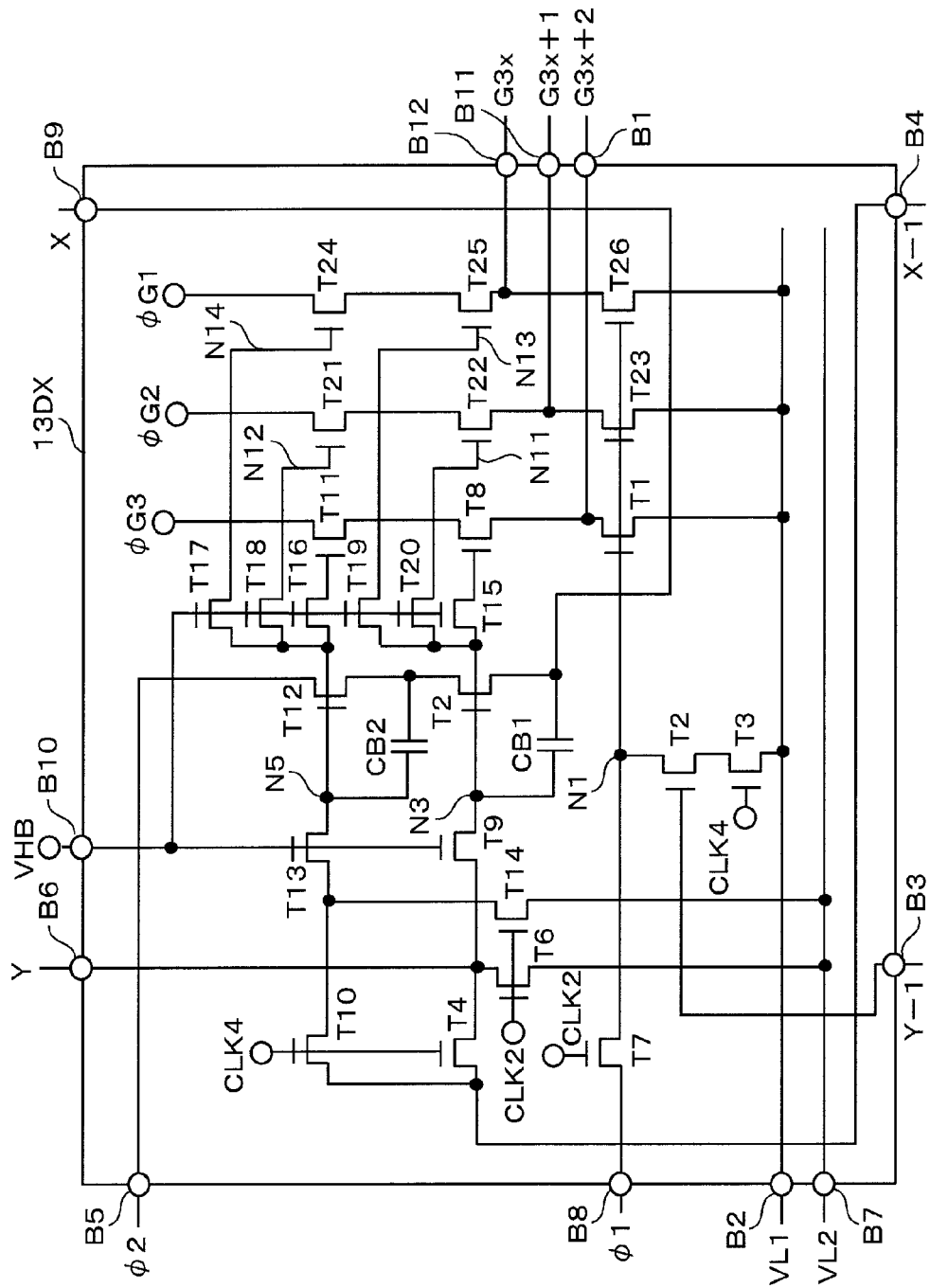
FIG. 7 is a circuit diagram of a thin film transistor circuit as a fifth embodiment of the present disclosure.
Figure 8:
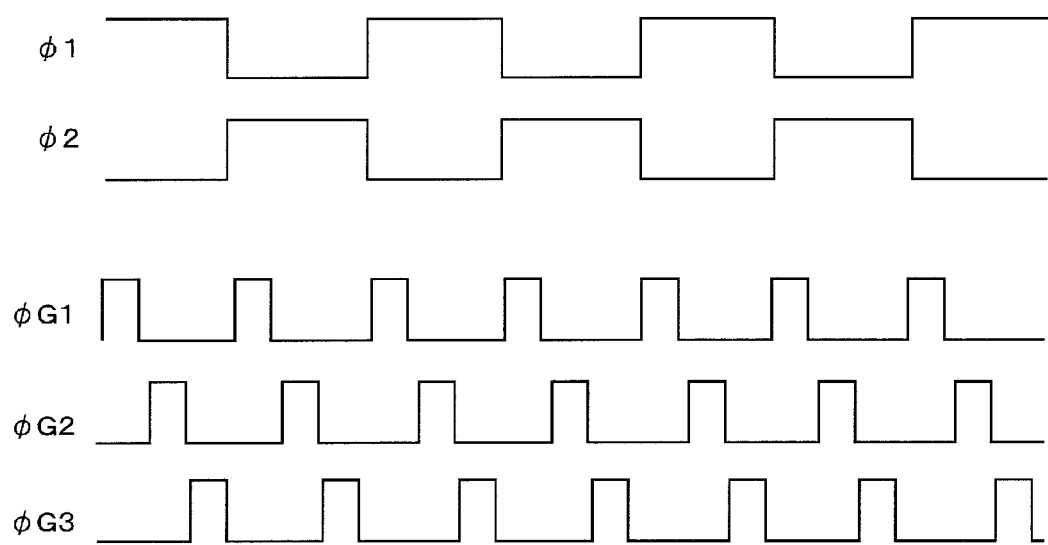
FIG. 8 is a timing chart of drive pulses for a scan circuit that uses the thin film transistor circuit of the fifth embodiment.

FIG. 7 is a circuit diagram of a thin film transistor circuit as the fifth embodiment of the present disclosure. FIG. 8 is a timing chart of drive pulses for a scan circuit that uses the thin film transistor circuit of the fifth embodiment. As with the first embodiment, the scan circuit 13 is structured by connecting multiple thin film transistor circuits 13DX. The thin film transistor circuit 13DX of the fifth embodiment is formed by supplementing the thin film transistor circuit 13CX of the fourth embodiment with transistors T17, T18, T19, T20, T21, T22, T23, T24, T25 and T26. The transistor T17 is interposed between the gate of the transistor T24 (node N14) and the node N5. The transistor T18 is interposed between the gate of the transistor T21 (node N12) and the node N5. The transistor T19 is interposed between the gate of the transistor T25 (node N13) and the node N1. The transistor T20 is interposed between the gate of the transistor T22 (node N9) and the node N1. The role of the transistors T17, T18, T19 and T20 is the same as that of the components listed in the paragraph (b) above in connection with the third embodiment and thus will not be discussed further.

The transistor T21 is connected to the transistor T22. The transistor T22 is connected to a boundary node B11. A drive pulse (φG2) is input to the transistor T21. The transistor T24 is connected to the transistor T25. The transistor T25 is connected to a boundary node B12. A drive pulse (φG1) is input to the transistor T24. A drive pulse (φG3) is input to the transistor T11. The role of the transistors T11, T21 and T24 is the same as that of the components listed in the paragraph (b) above in connection with the third embodiment and thus will not be discussed further.

The transistor T23 is connected interposingly between the boundary node B11 and the boundary node B2. The gate of the transistor T23 is connected to the node N1. The transistor T26 is connected interposingly between the boundary node B12 and the boundary node B2. The gate of the transistor T26 is connected to the node N1. An output signal (G3X+2) is output from the boundary node B1 onto the gate signal lines; an output signal (G3X+1) is output from the boundary node B11 onto the gate signal lines; and an output signal (G3X) is output from the boundary node B12 onto the gate signal lines.

In FIG. 7, there is no clearly defined bootstrap capacitor interposed between the node N3 and the boundary node B1, between a node N11 and the boundary node B11, and between the node N13 and the boundary node B12. There also is no clearly defined bootstrap capacitor interposed between the node N5 on the one hand and a connection point between the transistor T11 and the transistor T8 on the other hand, between the node N12 on the one hand and a connection point between the transistor T21 and the transistor T22 on the other hand, and between the node N14 on the one hand and a connection point between the transistor T24 and the transistor T25 on the other hand. That is because the transistors T11, T8, T21, T22, T24 and T25 are TFTs with a large gate width (W) so that the channel-gate capacitance of each TFT has a function similar to the bootstrap capacitor. Alternatively, bootstrap capacitors may be additionally interposed between the components involved.

The thin film transistor circuit 13DX is configured in such a manner that three gate signal lines are scanned given a transfer of data from one stage to the next on a shift register. This makes it possible to lower the frequencies of the transfer clock pulses (CLK1, CLK2, CLK3 and CLK4), which is effective where the number of pixels is increased, for example. FIG. 8 shows the relations between the pulses φ1 and φ2 as well as between these pulses on the one hand and the pulses φG1, φG2 and φG3 on the other hand. When the pulse φ1 or φ2 is at the high level, the pulses φG1, φG2 and φG3 are also at the high level. This means that while the output signal (X) or (Y) is being transferred to the next-stage thin film transistor circuit, the output signals (G3X, G3X+1 and G3X+2) are output onto three gate signal lines. The other workings are the same as those of the thin film transistor circuit 13CX of the fourth embodiment.

It is to be understood that while the disclosure by the inventors has been described in conjunction with specific embodiments and examples, it is evident that many alternatives, modifications and variations will become apparent to those skilled in the art in light of the foregoing description. Accordingly, it is intended that the present disclosure embrace all such alternatives, modifications and variations as fall within the spirit and scope of the appended claims.

Some key elements of the above-described embodiments are recapitulated below.

(1) There is provided a thin film transistor circuit (13X, 13XA, 13XB, 13XC, 13XD) including: a first node (B1) from which a first output signal (X, GX) is output; a second node (B2) which receives a first low voltage (VL1); a third node (B3) which receives a first input signal (Y−1); a first transistor (T1) connected interposingly between the first node (B1) and the second node (B2), and a second transistor (T2) connected interposingly between the gate node (N1) of the first transistor (T1) and the second node (B2). The gate node of the second transistor (T2) is connected to the third node (B3) and, when the first input signal (Y−1) is changed from a high level (VH2) to a low level (VL2), the gate node of the first transistor (T1) is driven lower than the first low voltage (VL1).

(2) The thin film transistor circuit described in paragraph (1) above may further include a third transistor (T3) connected interposingly between the second transistor (T2) and the second node (B2). A first control pulse (CLK4) may be applied to the gate node of the third transistor (T3). When the gate node (N1) of the first transistor (T1) and a connection point (N2) connecting the second transistor (T2) to the third transistor (T3) are put in a floating state, the first input signal (Y−1) may be changed from the high level (VH2) to the low level (VL2).

(3) The thin film transistor circuit described in paragraph (2) above may further include: a fourth node which (B4) receives a second input signal (X−1); a fifth node (B5) which receives a first drive pulse (φ2); a sixth node (B6) from which a second output signal (Y) is output; a fourth transistor (T4) connected to the fourth node (B4); a fifth transistor (T5) connected to the fifth node (B5), and a first bootstrap capacitor (CB1). The fourth transistor (T4) may be connected to the gate node (N3) of the fifth transistor (T5). One end of the first bootstrap capacitor (CB1) may be connected to the gate node (N3) of the fifth transistor (T5). The other end of the first bootstrap capacitor (CB1) may be connected to the terminal opposite to that to which the fifth node (B5) of the fifth transistor (T5) is connected. A voltage (VH2) higher than the high-level voltage (VH) of the first drive pulse (φ2) may be output from the sixth node (B6).

(4) The thin film transistor described in paragraph (3) above may further include a seventh node (B7) which receives a second low voltage (VL2), and a sixth transistor (T6) connected interposingly between the gate node (N3) of the fifth transistor (T5) and the seventh node (B7). A second control pulse (CLK2) may be applied to the gate node of the sixth transistor (T6). The first control pulse (CLK4) and the second control pulse (CLK2) may be different in phase from each other. The second low voltage (VL2) may be lower than the first low voltage (VL1).

(5) The thin film transistor circuit described in paragraph (4) above may further include an eighth node (B8) which receives a second drive pulse (φ1), and a seventh transistor (T7) connected interposingly between the gate node (N1) of the first transistor (T1) and the eighth node (B8). The first drive pulse (φ2) and the second drive pulse (φ1) may be different in phase from each other.

(6) In the thin film transistor circuit described in paragraph (5) above, the low-level voltage of the first and the second drive pulses (φ2, φ1) may be the first low voltage (VL1). The low-level voltage of the first and the second control pulses (CLK4, CLK2) may be a third low voltage (VL3) that is lower than the second low voltage.

(7) The thin film transistor circuit described in paragraph (6) above may further include a ninth node (B9) form which a third output signal is output, and an eighth transistor (T8) connected interposingly between the first node (B9) and the fifth node (B5). The gate node (N3) of the fifth transistor (T5) may be connected to the gate node of the eighth transistor (T8). The fifth transistor (T5) may be connected interposingly between the fifth node (B5) and the ninth node (B8).

(8) The thin film transistor circuit described in paragraph (7) above may further include a tenth node (B10) to which a predetermined high voltage (VHB) is applied, and a ninth transistor (T9) connected interposingly between a connection point (N3) connecting the gate node (N3) of the fifth transistor (T5) to the first bootstrap capacitor (CB1) on the one hand, and a connection point (N4) connecting the gate node (N3) of the fifth transistor (T5) to the sixth transistor (T6) on the other hand. The tenth node (B10) may be connected to the gate node of the ninth transistor (T9).

(9) The thin film transistor circuit described in paragraph (8) above may further include: a tenth transistor (T10) connected to the fourth node (B4); an eleventh transistor (T11) connected to the eighth transistor (T8); a twelfth transistor (T12) connected interposingly between the fifth node (B5) and the fifth transistor (T5); a thirteenth transistor (T13); a fourteenth transistor (T14), and a second bootstrap capacitor (CB2). The thirteenth transistor (T13) may be connected interposingly between a connection point (N5) connecting the gate node of the eleventh transistor (T11) to the gate node of the twelfth transistor (T12) on the one hand, and the tenth transistor (T10) on the other hand. The second bootstrap capacitor may be connected interposingly between a connection point (N7) connecting the twelfth transistor (T12) to the fifth transistor (T5) on the one hand, and a connection point (N5) connecting the gate node of the eleventh transistor (T11) to the gate node of the twelfth transistor (T12) on the other hand. The fourteenth transistor (T14) may be connected interposingly between a connection point (N6) connecting the tenth transistor (T10) to the thirteenth transistor (T13) on the one hand, and the seventh node (B7) on the other hand. The first control pulse (CLK4) may be applied to the gate node of the tenth transistor (T10). The predetermined high voltage may be applied to the gate node of the thirteenth transistor (T13). The second control pulse (CLK2) may be applied to the gate node of the fourteenth transistor (T14).

(10) The thin film transistor circuit described in paragraph (9) above may further include a fifteenth transistor (T15), and a sixteenth transistor (T16). The fifteenth transistor (T15) may be connected interposingly between the gate node (N3) of the fifth transistor (T5) and the gate node of the eighth transistor (T8). The sixteenth transistor (T16) may be connected interposingly between the gate node (N5) of the twelfth transistor (T12) and the gate node of the eleventh transistor (T11). The predetermined high voltage may be applied to the gate nodes of the fifteenth and the sixteenth transistors (T15, T16).

(11) In the thin film transistor circuit described in paragraph (9) or (10) above, the eleventh transistor (T11) may be connected interposingly between the fifth node (B5) and the eighth transistor (T8).

(12) The thin film transistor circuit described in paragraph (10) above may further include: an eleventh node (B11) from which a fourth output signal (G3X+1) is output; a twelfth node (B12) form which a fifth output signal (G3X) is output; a seventeenth transistor (T17); an eighteenth transistor (T18); a nineteenth transistor (T19); a twentieth transistor (T20); a twenty-first transistor (T21); a twenty-second transistor (T22) connected interposingly between the eleventh node (B11) and the twenty-first transistor (T21); a twenty-third transistor (T23) connected interposingly between the eleventh node (B11) and the second node (B2); a twenty-fourth transistor (T24); a twenty-fifth transistor (T25) connected interposingly between the twelfth node (B12) and the twenty-fourth transistor (T24), and a twenty-sixth transistor (T26) connected interposingly between the twelfth node (B12) and the second node (B2). The gate nodes of the twenty-third and the twenty-sixth transistors (T23, T26) may be connected to the gate node (N1) of the first transistor (T1). The seventeenth transistor (T17) may be connected interposingly between the gate node (N5) of the twelfth transistor (T12) and the gate node of the twenty-fourth transistor (T24). The eighteenth transistor (T18) may be connected interposingly between the gate node (N5) of the twelfth transistor (T12) and the gate node of the twenty-first transistor (T21). The nineteenth transistor (T19) may be connected interposingly between the gate node (N3) of the fifth transistor (T5) and the gate node of the twenty-fifth transistor (T25). The twentieth transistor (T20) may be connected interposingly between the gate node (N3) of the fifth transistor (T5) and the gate node of the twenty-second transistor (T22). The predetermined high voltage may be applied to the gate nodes of the seventeenth, the eighteenth, the nineteenth and the twentieth transistors (T17, T18, T19, T20). A third drive pulse (φG1) may be applied to the twenty-fourth transistor (T24). A fourth drive pulse (φG2) may be applied to the twenty-first transistor (T21). A fifth drive pulse (φG3) may be applied to the eleventh transistor (T11).

(13) In the thin film transistor circuit described in paragraph (12) above, the third, the fourth and the fifth drive pulses (φG1, φG2, φG3) may be output while one of the first and the second drive pulses (φ2, φ1) is being at the high level.

(14) There is also provided a display device (11) including a display unit (12), a scan circuit (13), and a driver IC (14). The scan circuit (13) includes: a first node (B1) from which a first output signal (X, GX) is output; a second node (B2) which receives a first low voltage (VL1); a third node (B3) which receives a first input signal (Y−1); a first thin film transistor (T1) connected interposingly between the first node (B1) and the second node (B2), and a second thin film transistor (T2) connected interposingly between the gate node (N1) of the first thin film transistor (T1) and the second node (B2). The gate node of the second thin film transistor (T2) is connected to the third node (B3) and, when the first input signal (Y−1) is changed from a high level (VH2) to a low level (VL2), the gate node of the first thin film transistor (T1) is driven lower than the first low voltage (VL1).

(15) In the display device described in paragraph (14) above, each of the first and the second thin film transistors (T1, T2) uses as the semiconductor layer thereof an oxide semiconductor.

What is claimed is:
1. A thin film transistor circuit comprising:
a first node from which a first output signal is output;
a second node which receives a first low voltage;
a third node which receives a first input signal;
a first transistor connected interposingly between the first node and the second node,
a second transistor connected interposingly between a gate node of the first transistor and the second node; and
a third transistor connected interposingly between the second transistor and the second node;
wherein the gate node of the second transistor is connected to the third node and, when the first input signal is changed from a high level to a low level, the gate node of the first transistor is driven lower than the first low voltage, wherein a first control pulse is applied to a gate node the third transistor, and wherein, when the gate mode of the first transistor and a connection point connecting the second transistor to the third transistor are put in a floating state, the first input signal is changed from the high level to the low level.

2. The thin film transistor circuit according to claim 1, further comprising:
a fourth node which receives a second input signal;
a fifth node which receives a first drive pulse;
a sixth node from which a second output signal is output;
a fourth transistor connected to the fourth node;
a fifth transistor connected to the fifth node; and
a first bootstrap capacitor;
wherein the fourth transistor is connected to a gate node of the fifth transistor;
wherein one end of the first bootstrap capacitor is connected to the gate node of the fifth transistor;
wherein the other end of the first bootstrap capacitor is connected to the terminal opposite to that to which the fifth node of the fifth transistor is connected, and
wherein a voltage higher than the high-level voltage of the first drive pulse is output from the sixth node.

3. The thin film transistor according to claim 2, further comprising:
a seventh node which receives a second low voltage, and
a sixth transistor connected interposingly between the gate node of the fifth transistor and the seventh node;
wherein a second control pulse is applied to a gate node of the sixth transistor;
wherein the first control pulse and the second control pulse are different in phase from each other, and wherein the second low-voltage is lower than the first low voltage.

4. The thin film transistor circuit according to claim 3, further comprising:
an eighth node which receives a second driver pulse, and a seventh transistor connected interposingly between the gate node of the first transistor and the eighth node;
wherein the first drive pulse and the second drive pulse are different in phase from each other.

5. The thin film transistor circuit according to claim 4, wherein the low-level voltage of the first and the second driver pulses is the first low voltage, and
wherein the low-level voltage of the first and second control pulses is a third low voltage that is lower than the second low voltage.

6. The thin film transistor circuit according to claim 5, further comprising:
a ninth node form which a third output signal is output, and
an eighth transistor connected interposingly between the first node and the fifth node;
wherein a gate node of the fifth transistor is connected to the gate node of the eighth transistor, and
wherein the fifth transistor is connected interposingly between the fifth node and the ninth node.

7. The thin film transistor circuit according to claim 6, further comprising:
a tenth node to which a predetermined high voltage is applied, and
a ninth transistor connected interposingly between a connection point connecting the gate node of the fifth transistor to the first bootstrap capacitor on the one hand, and a connection point connecting the gate node of the fifth transistor to the sixth transistor on the other hand;

wherein the tenth node is connected to a gate node of the ninth transistor.

8. The thin film transistor circuit according to claim 7, further comprising:
a tenth transistor connected to the fourth node;
an eleventh transistor connected to the eighth transistor;
a twelfth transistor connected interposingly between the fifth node and the fifth transistor;
a thirteenth transistor;
a fourteenth transistor; and
a second bootstrap capacitor;
wherein the thirteenth transistor is connected interposingly between a connection point connecting a gate node of the eleventh transistor to a gate node of the twelfth transistor on the one hand, and the tenth transistor on the other hand;
wherein the second bootstrap capacitor is connected interposingly between a connection point connecting the twelfth transistor to the fifth transistor on the one hand, and a connection point connecting the gate node of the eleventh transistor to the gate node of the twelfth transistor on the other hand;
wherein the fourteenth transistor is connected interposingly between a connection point connecting the tenth transistor to the thirteenth transistor on the one hand, and the seventh node on the other hand;
wherein the first control pulse is applied to a gate node of the tenth transistor;
wherein the predetermined high voltage is applied to a gate node of the thirteenth transistor, and
wherein the second control pulse is applied to a gate node of the fourteenth transistor.

9. The thin film transistor circuit according to claim 8, further comprising:
a fifteenth transistor, and
a sixteenth transistor;
wherein the fifteenth transistor is connected interposingly between the gate node of the fifth transistor and the gate node of the eighth transistor;
wherein the sixteenth transistor is connected interposingly between the gate node of the twelfth transistor and the gate node of the eleventh transistor, and
wherein the predetermined voltage high voltage is applied to gate nodes of the fifteenth and the sixteenth transistors.

10. The thin film transistor circuit according to claim 8, wherein the eleventh transistor is connected interposingly between the fifth node and the eighth transistor.

11. The thin film transistor circuit according to claim 9, further comprising:
an eleventh node from which a fourth output signal is output;
a twelfth node from which a fifth output signal is output;
a seventeenth transistor;
an eighteenth transistor;
a nineteenth transistor;
a twentieth transistor;
a twenty-first transistor;
a twenty-second transistor connected interposingly between the eleventh node and the twenty-first transistor;
a twenty-third transistor connected interposingly between the eleventh node and the second node;
a twenty-fourth transistor;
a twenty-fifth transistor connected interposingly between the twelfth node and the twenty-fourth transistor, and a twenty-sixth transistor connected interposingly between the twelfth node and the second node;

wherein the gate nodes of the twenty-third and the twenty-sixth transistors are connected to the gate node of the first transistor;

wherein the seventeenth transistor is connected interposingly between the gate node of the twelfth transistor and a gate node of the twenty-fourth transistor;

wherein the eighteenth transistor is connected interposingly between the gate node of the twelfth transistor and a gate node of the twenty-first transistor;

wherein the nineteenth transistor is connected interposingly between the gate node of the fifth transistor and a gate node of the twenty-fifth transistor;

wherein the twentieth transistor is connected interposingly between the gate node of the fifth transistor and a gate node of the twenty-second transistor, wherein the predetermined high voltage is applied to gate nodes of the seventeenth, the eighteenth, the nineteenth and the twentieth transistors;

wherein a third drive pulse is applied to the twenty-fourth transistor;

wherein a fourth drive pulse is applied to the twenty-first transistor;

wherein a fifth drive pulse is applied to the eleventh transistor.

12. The thin film transistor circuit according to claim 11, wherein the third, the fourth and the fifth drive pulses are output while one of the first and the second drive pulses is being at the high level.

13. The thin film transistor circuit according to claim 9, wherein the eleventh transistor is connected interposingly between the fifth node and the eighth transistor.

* * * * *